(12) United States Patent
Baran

(10) Patent No.: US 6,331,935 B1
(45) Date of Patent: *Dec. 18, 2001

(54) CONTROLLER ASSEMBLY HAVING A BASE UNIT WITH A DOCKABLE PROCESSOR UNIT

(75) Inventor: Michael S. Baran, Elm Grove, WI (US)

(73) Assignee: Rockwell Automation Technologies, Inc., Mayfield Heights, OH (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,104

(22) Filed: Sep. 29, 1998

(51) Int. Cl.[7] .................................. G06F 1/16; H05K 7/14
(52) U.S. Cl. ............................................. 361/686; 361/726
(58) Field of Search ..................................... 361/686, 683, 361/724, 725, 726; 312/223.1, 223.2

(56) References Cited

U.S. PATENT DOCUMENTS

| | | | |
|---|---|---|---|
| 4,558,914 | * | 12/1985 | Prager et al. ........................ 361/686 |
| 5,311,397 | * | 5/1994 | Harshberger et al. ............... 361/683 |
| 5,515,239 | * | 5/1996 | Kamerman et al. ................. 361/727 |
| 5,561,589 | * | 10/1996 | Mesfin et al. ....................... 361/686 |
| 6,008,985 | * | 12/1999 | Lake et al. .......................... 361/686 |
| 6,029,215 | * | 2/2000 | Watts, Jr. et al. .................... 710/101 |
| 6,069,790 | * | 5/2000 | Howell et al. ....................... 361/686 |
| 6,076,124 | * | 6/2000 | Korowitz et al. .................... 710/102 |
| 6,154,680 | * | 11/2000 | White et al. .......................... 700/19 |

* cited by examiner

Primary Examiner—Lynn D. Feild
(74) Attorney, Agent, or Firm—Robert A. Van Someren; Alexander M. Gerasimow; William R. Walbrun

(57) ABSTRACT

A controller assembly utilizes a base unit that receives a dockable processor unit. The controller assembly typically is a programmable logic controller that permits base units and processor units to be interchanged according to the requirements of a specific application. The base unit includes a power supply, I/O circuitry and interface circuitry, and the processor unit includes a processor, such as a CPU. A unique latching mechanism secures the processor unit to the base unit. The latching mechanism also includes a lever assembly that facilitates removal of the processor unit from the base unit.

20 Claims, 8 Drawing Sheets

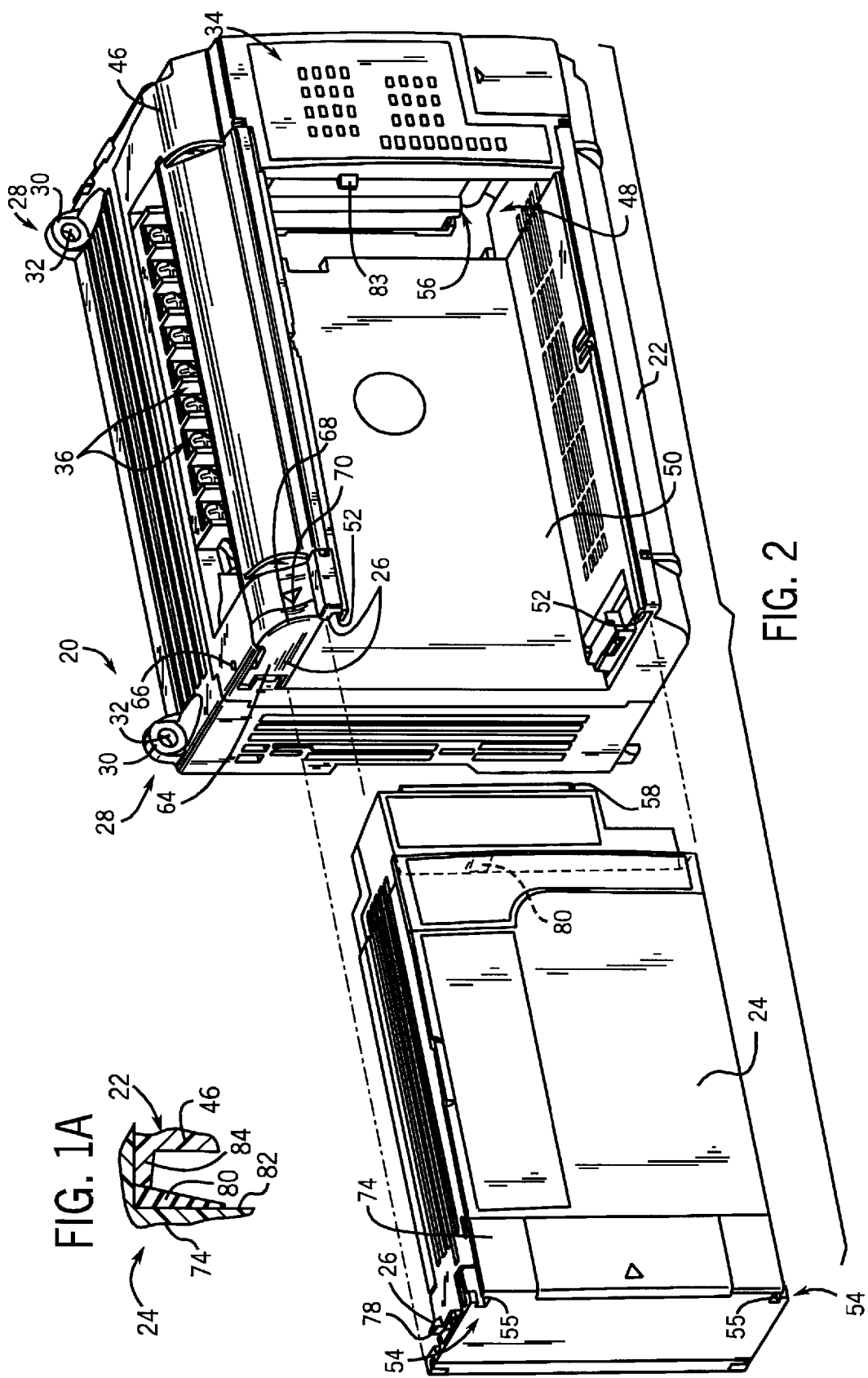

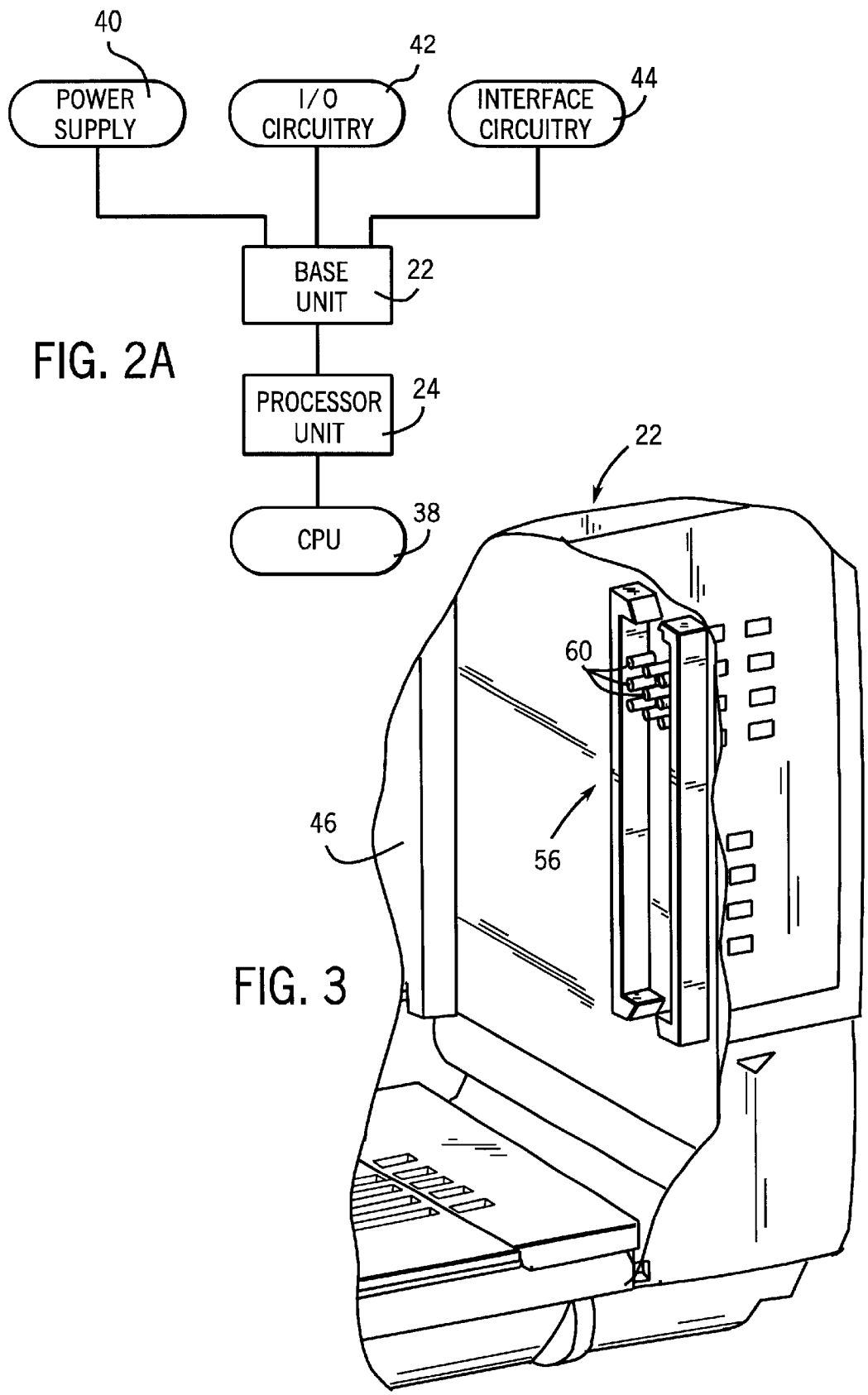

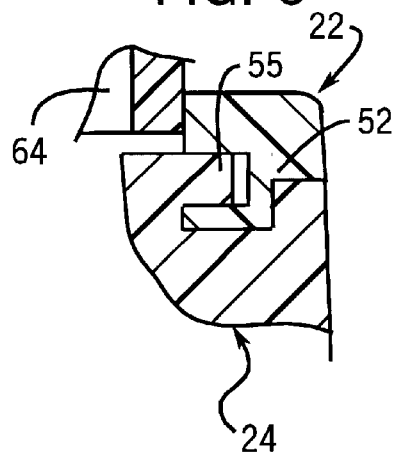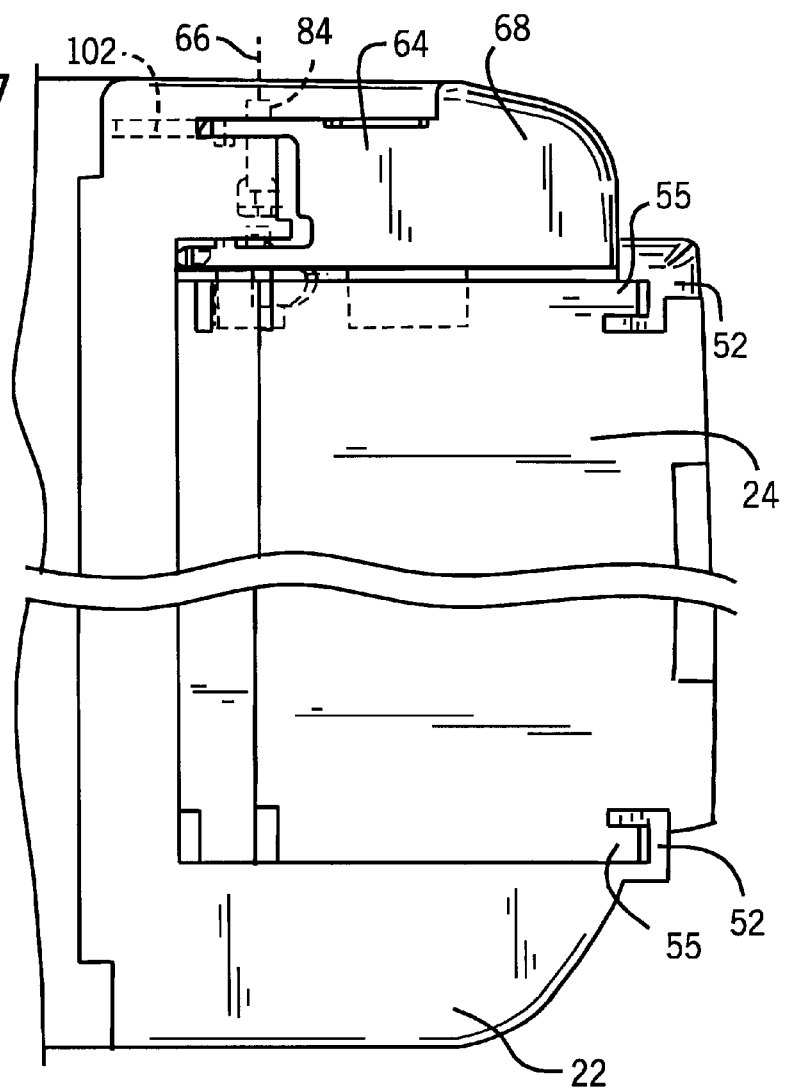

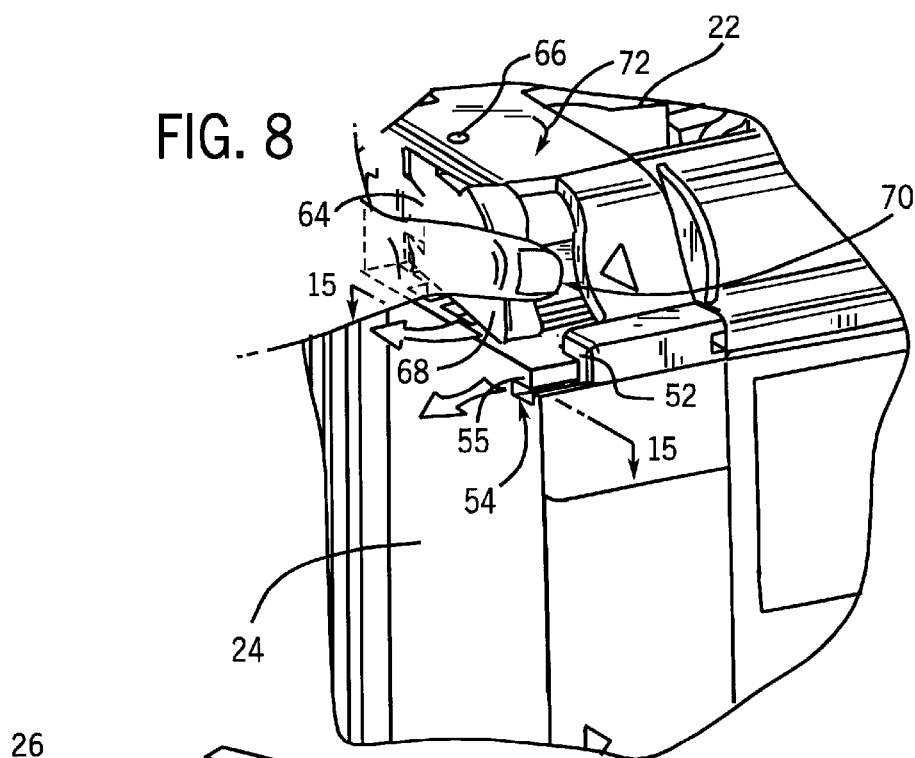
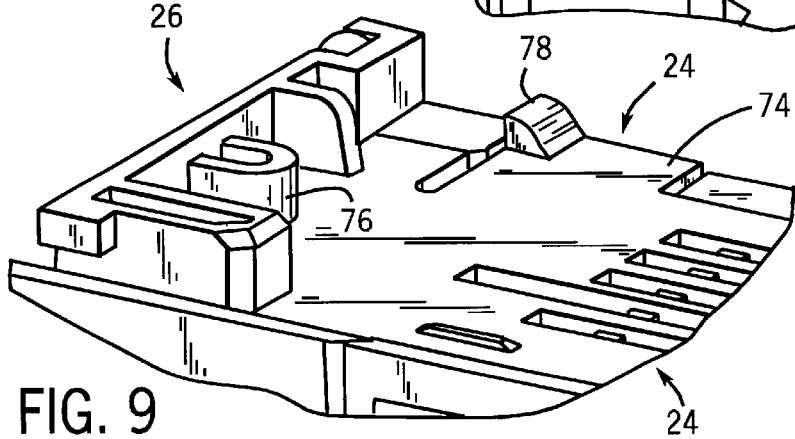
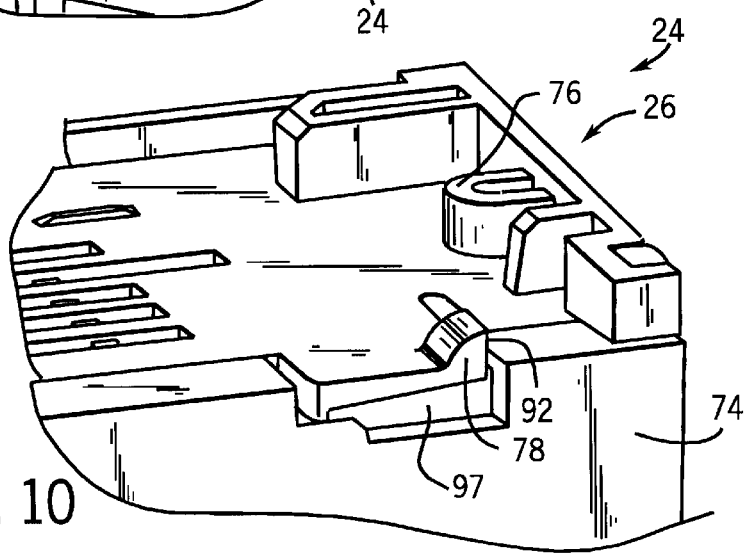

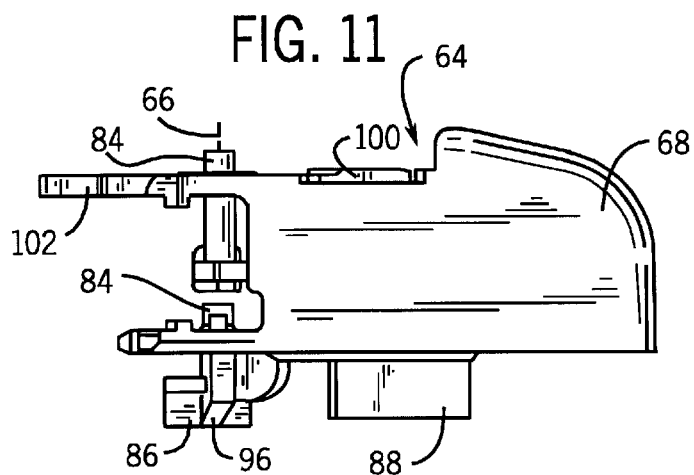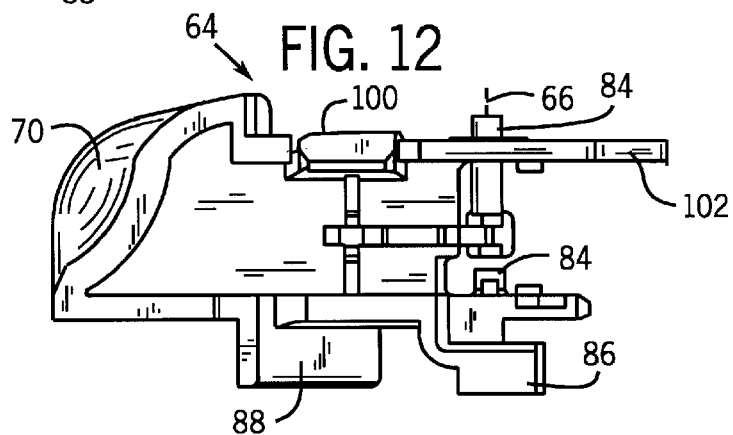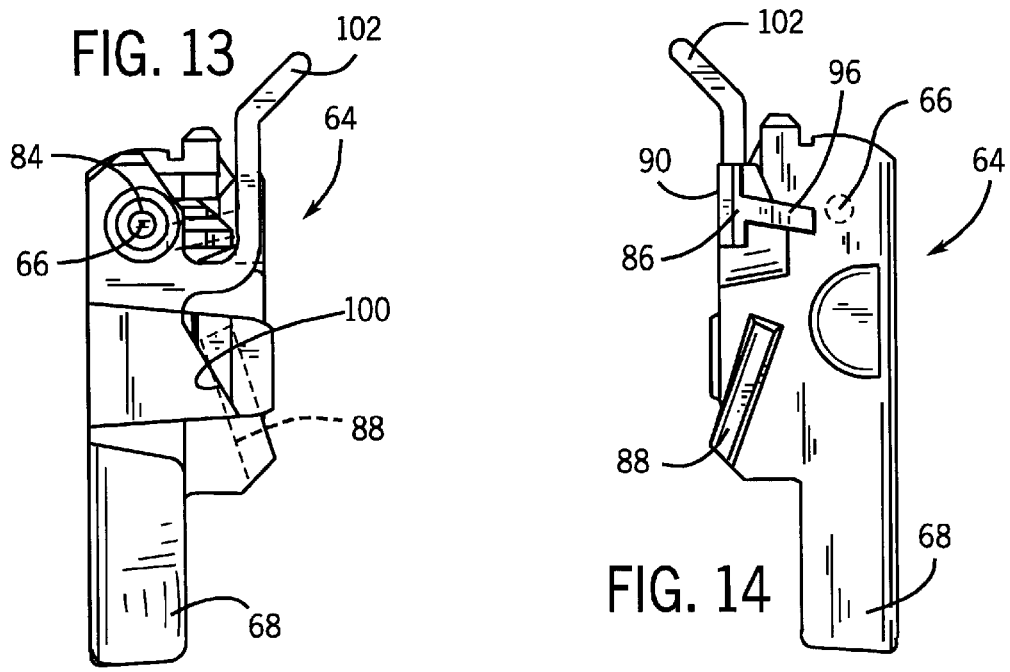

CONTROLLER ASSEMBLY HAVING A BASE UNIT WITH A DOCKABLE PROCESSOR UNIT

FIELD OF THE INVENTION

The present invention relates generally to controller assemblies, such as those used in a programmable logic controller (PLC) system, and particularly to packaged controllers utilizing a base unit and a processor unit.

BACKGROUND OF THE INVENTION

Controllers are used throughout industry to control and monitor a wide range of machines and other movable components and systems. In an exemplary controller, such as that used in a PLC system, the controller may have power supply circuitry, I/O circuitry, interface circuitry, etc. combined with a processor, such as a CPU.

Generally, controllers are available with a wide range of capabilities and processing power. Conventional PLC systems utilize a plurality of modules that are mechanically mounted in a rack system and electrically connected along a back plane. The individual modules can be interchanged or replaced as required by a given system application.

Some PLCs, referred to as packaged controllers, typically are used for smaller machines or systems and include a single integral system having its own power supply, input/output circuitry, interface circuitry and processor in a single unit.

With packaged controllers, the entire controller e.g., PLC, must be purchased with appropriate power supply, I/O circuitry, interface circuitry, processor, etc. for the particular task or environment in which it will be used. The purchaser is limited to the available preconfigured controllers and has limited ability to upgrade a packaged controller system without purchasing a new system. Additionally, the purchaser is limited to the capabilities and features of the commercially available control systems.

It would be advantageous from both the customer's perspective and the manufacturer's perspective to design packaged controller assemblies having modular components that could be selectively interchanged. For example, it would be advantageous to have a PLC separated into two interchangeable components, such as a base unit containing a power supply, power supply circuitry, I/O circuitry, interface circuitry, etc., and a separate processor unit containing a control device, such as a CPU, for the base unit. Such a design would provide both the customer and the manufacturer great flexibility in delivering many configurations of a controller assembly with a smaller number of manufactured components.

SUMMARY OF THE INVENTION

In one preferred embodiment, the present invention features a dockable processor unit system. The system comprises a processor unit and a base unit configured to receive the processor unit. A latching mechanism is provided to selectively latch the processor unit to the base unit. The latching mechanism includes an integral lever disposed to facilitate separation of the processor unit from the base unit.

According to another aspect of the invention, a programmable logic controller system is provided. The system comprises a base unit and a processor unit configured to engage the base unit. A latching mechanism is designed to selectively hold and release the processor unit with respect to the base unit.

According to another aspect of the present invention, a method is provided for selectively latching a processor unit to a base unit of a programmable logic controller system. The method includes configuring a base unit with a receptacle for receiving a processor unit and selectively engaging the processor unit with the base unit. The method further includes connecting a latching mechanism to the base unit and the processor unit to selectively hold the processor unit in engagement with the base unit and to selectively release the processor unit from the base unit. Also, a lever is incorporated with the latching mechanism to provide a user with mechanical advantage in disengaging the processor unit from the base unit.

BRIEF DESCRIPTION OF THE DRAWINGS

The invention will hereafter be described with reference to the accompanying drawings, wherein like reference numerals denote like elements, and:

FIG. 1A is a partial cross-sectional view taken generally along line 1A—1A of FIG. 1;

FIG. 2 is a perspective view similar to FIG. 1, but showing the processor unit removed;

FIG. 2A is a schematic illustration representing exemplary functionality of the base unit and processor unit illustrated in FIGS. 1 and 2;

FIG. 3 is a perspective view of a portion of the base unit of the controller assembly according to a preferred embodiment of the present invention;

FIG. 6 is a partial cross-sectional view taken generally along line 6—6 of FIG. 5;

FIG. 7 is a partial left end view of the processor unit mounted in the base unit taken generally along line 7—7 of FIG. 1;

FIG. 8 is a perspective view of the lever assembly illustrated in FIG. 1;

FIG. 9 is a front perspective view of the processor unit illustrating interlocking features;

FIG. 10 is a rear perspective view of the processor unit illustrating interlocking features;

FIG. 11 is a left side view of the lever illustrated in FIG. 8;

FIG. 12 is a right side view of the lever illustrated in FIG. 8;

FIG. 13 is a top view of the lever illustrated in FIG. 8;

FIG. 14 is a bottom view of the lever illustrated in FIG. 8;

DETAILED DESCRIPTION OF THE PREFERRED EMBODIMENTS

Figure 1:
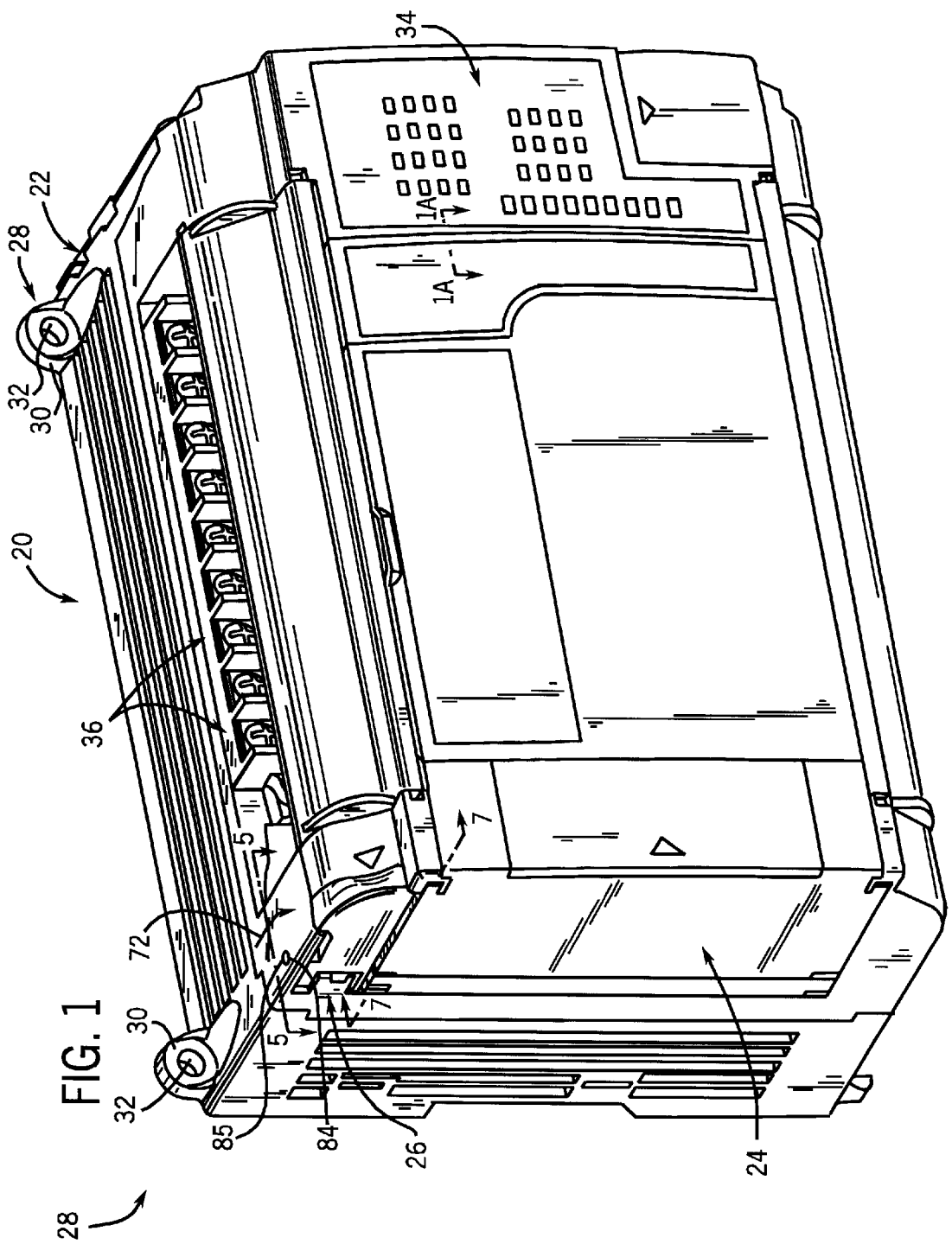
FIG. 1 is a perspective view of an assembled controller assembly, according to a preferred embodiment of the present invention.

Referring generally to FIGS. 1 and 2, a controller assembly 20 is illustrated according to a preferred embodiment of the present invention. Controller assembly 20 comprises a base unit 22 and a processor unit 24. Processor unit 24 is dockable in base unit 22 and selectively held in place by a latching mechanism 26.

The modular approach to the construction of controller assembly 20 permits a range of base units 22 and processor units 24 to be interchanged. For example, by making available 6 types of base units and 3 types of processor units that may be selectively coupled together, 18 configurations of controller assembly 20 are possible. This type of modular system can be incorporated into many controller assembly designs, and the specific design illustrated is merely exemplary. The specific configuration of the base unit 22 and processor unit 24, as well as the layout of features, may be varied without departing from the scope of the present invention.

In the illustrated embodiment, base unit 22 includes a mounting mechanism 28 comprising a plurality of bosses 30 having apertures 32 for receiving fasteners (not shown) therethrough. Additionally, base unit 22 includes an LED panel 34 through which inputs and outputs of controller assembly 20 may be monitored. Base unit 22 also includes a plurality of contact terminals 36 through which input and output signals flow from and to devices to which controller assembly 20 may be connected.

As illustrated in the diagram of FIG. 2A, processor unit 24 includes a processor 38, such as a CPU. The base unit 22, on the other hand, includes supporting circuitry, such as a power supply and power supply circuitry 40, input/output (I/O) circuitry 42 and interface circuitry 44. Base unit 22 potentially can be designed in many configurations with specific supporting circuitry for desired applications, and processor unit 24 can include a variety of processors designed to interact with base unit 22.

A preferred embodiment of the base unit 22 is illustrated in FIGS. 2 and 3. Base unit 22 includes an outer housing 46 that may have a variety of configurations. Outer housing 46 is designed with a docking area 48 that permits processor unit 24 to be docked with base unit 22. In the illustrated embodiment, docking area 48 comprises a cavity 50 formed in outer housing 46. Cavity 50 is sized to slidingly receive processor unit 24 therein.

Figure 5:
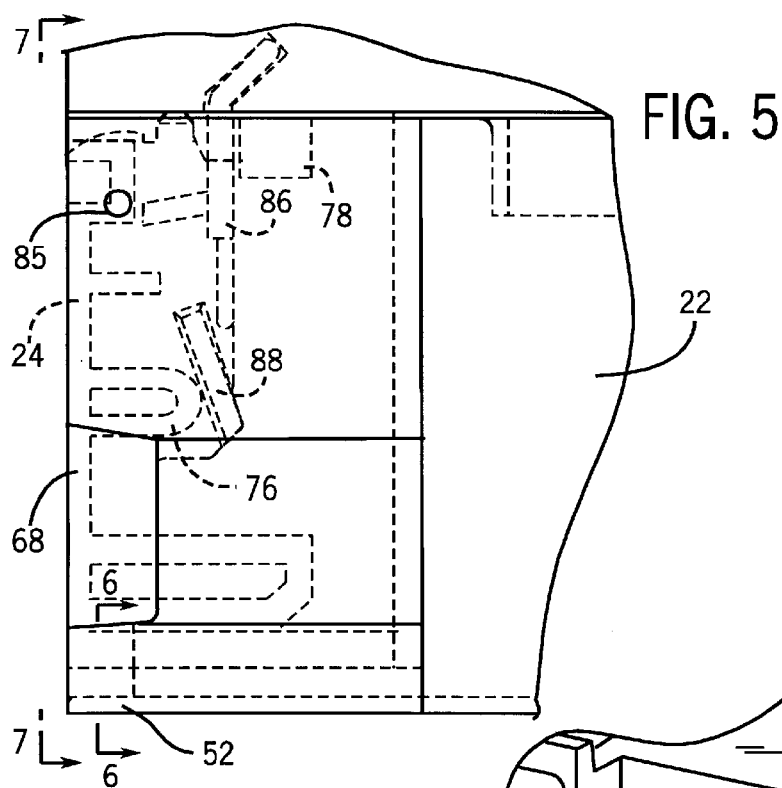
FIG. 5 is a partial top view of the processor unit and base unit taken generally along line 5—5 of FIG. 1, according to a preferred embodiment of the present invention.

Preferably, base unit 22 includes a plurality of interlock slots 52 formed in outer housing 46 along the side of cavity 50. Interlock slots 52 are designed to engage corresponding, mating interlocking features 54, such as protruding lips 55, on processor unit 24 (see also FIGS. 5 and 6). Base unit 22 also includes a base unit interface connector 56 disposed for conductive engagement with a processor unit interface connector 58 (see FIGS. 3 and 4). Base unit interface connector 56 provides a conductive path between the processor unit 24 and the various circuits of the base unit 22. Base unit interface connector 56 and processor unit interface connector 58 may have a variety of configurations. For example, base unit interface connector 56 may include a plurality of pins 60 arranged for mating engagement with a plurality of receptacles 62 disposed in processor unit interface connector 58.

Latching mechanism 26 cooperates both with base unit 22 and processor unit 24 to selectively lock or hold processor unit 24 in engagement with base unit 22. Additionally, latching mechanism 26 is designed to facilitate release of processor unit 24 from base unit 22 when servicing or changing the processor unit.

In the preferred illustrated embodiment, latching mechanism 26 includes a lever assembly 64 pivotably mounted to base unit 22 for pivotable movement about a pivot axis 66. (See FIGS. 2 and 7). Lever assembly 64 includes a lever handle 68 having a thumb grip area 70 for insertion of a thumb or finger to pull lever handle 68 and pivot lever assembly 64 about pivot axis 66. The pulling of lever handle 68 and the consequent pivoting of lever assembly 64 in the direction of arrow 72 (see FIG. 1) disengages processor unit 24 from base unit 22, as is described more fully below.

With reference to FIGS. 2, 4, 6 and 8–10, further aspects of controller assembly 20, latching mechanism 26 and processor unit 24 can be explained more fully. Generally, processor unit 24 includes an outer processor unit housing 74 in which the processor 38, e.g., microprocessor based CPU, is housed. Housing 74 preferably includes integrally molded interlocking features 54 to facilitate sliding engagement with base unit 22 at interlock slots 52. At the opposite end of housing 74 is disposed processing unit interface connector 58, as illustrated. The internal processor 38 is appropriately connected to interface connector 58 as dictated by the design of the processor and interface connector.

Additionally, processor unit housing 74 preferably includes portions of latching mechanism 26. Specifically, housing 74 includes a boss or pin 76 that interacts with lever assembly 64 to facilitate disengagement of processor unit 24 from base unit 22. Housing 74 also includes a pawl 78, which is a spring loaded member, as best illustrated in FIG. 10. Pawl 78 also is designed and disposed for engagement with lever assembly 64. Preferably, pawl 78 is on a generally opposite side of pivot axis 66 from pin 76 when processor unit 24 is engaged with base unit 22.

Figure 4:
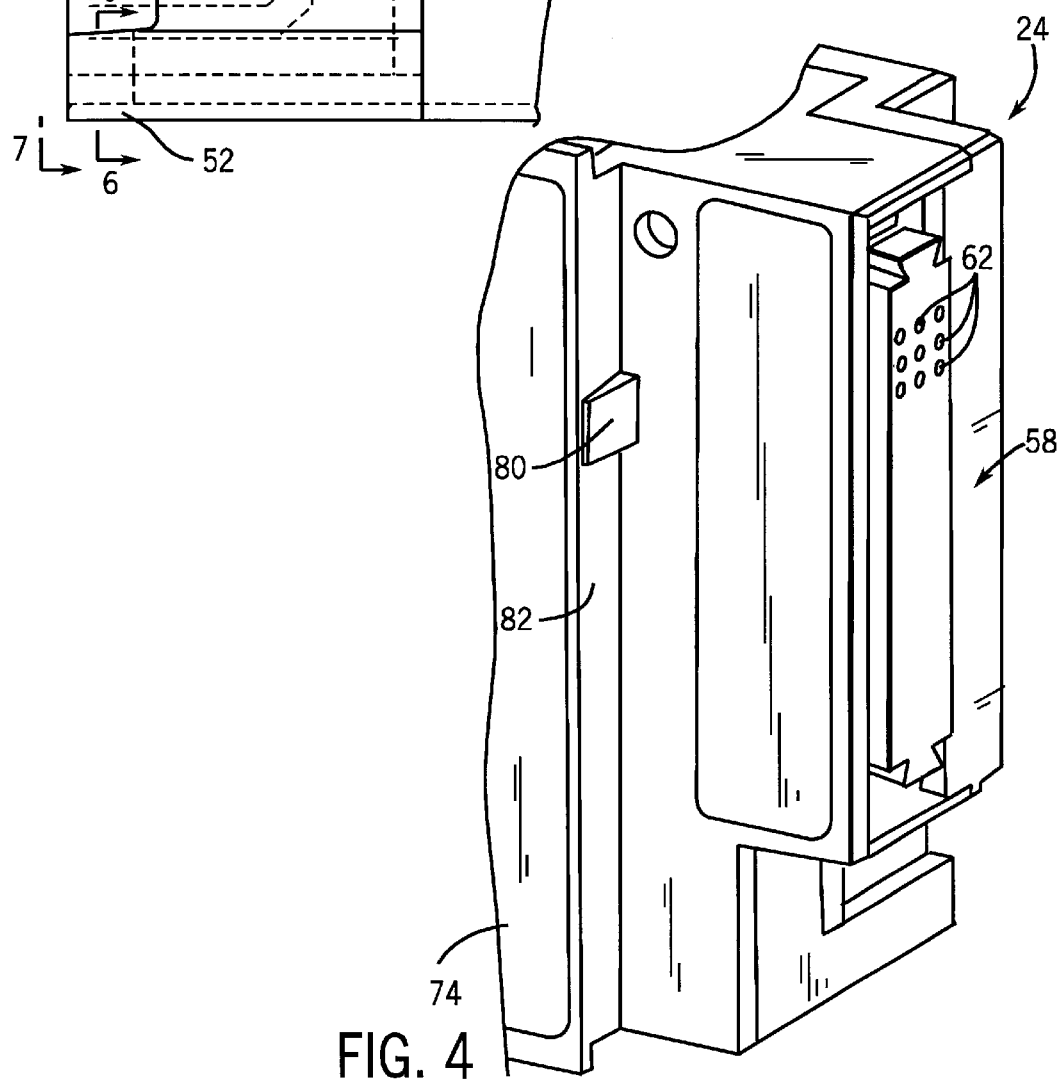
FIG. 4 is a perspective view of the right end of the processor unit illustrated in FIG. 2.

Additionally, housing 74 includes an elastomeric preload member 80, preferably disposed on an opposite end of housing 74 from pawl 78. Elastomeric preload member 80 is a resilient plastic or rubber member that extends from an end wall 82 of housing 74 as best illustrated in FIG. 4. Preload member 80 is located for engagement with a boss 83 mounted to outer housing 46 of base unit 22 along an edge of cavity 50, as best illustrated in FIGS. 1A and 2. When processor unit 24 is inserted into cavity 50 for engagement with base unit 22, pawl 78 maintains processor unit 24 in the engaged position, while elastomeric preload member 80 biases pawl 78 and processor unit 24 into constant engagement with latching mechanism 26. This ensures a secure, reliable connection between processor unit 24 and base unit 22 even in relatively harsh industrial environments subject to substantial vibration.

Referring generally to FIGS. 5 and 11–16, a preferred embodiment of lever assembly 64 is illustrated, and its function can be described. Lever assembly 64 is designed for pivotable motion about pivot axis 66. To that end, lever assembly 64 includes a pin and preferably two pins 84 that are generally aligned with the pivot axis 66. Pins 84 are rotatably received in corresponding apertures 85 formed in outer housing 46 of base unit 22 (see apertures 85 in FIG. 1).

Figure 15:
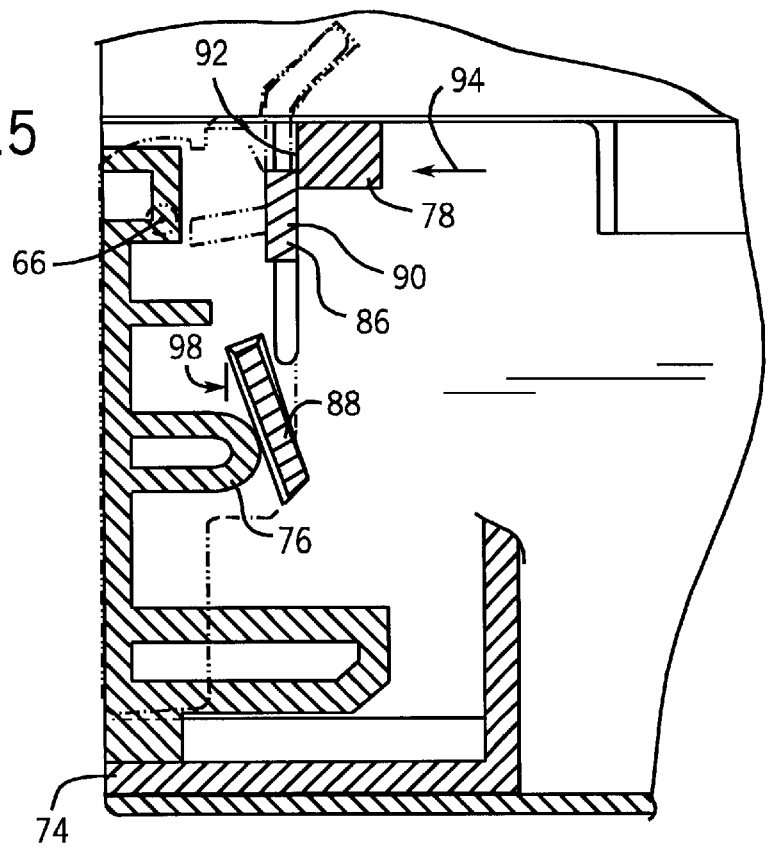
FIG. 15 is a cross-sectional view taken generally along line 15—15 of FIG. 8.

Lever assembly 64 also includes a tooth 86 and a disengagement bar 88. Tooth 86 and disengagement bar 88 are substantially on opposite sides of pivot axis 66. Tooth 86 is positioned for contact with pawl 78 when processor unit 24 is inserted into and engaged with base unit 22. Additionally, disengagement bar 88 is positioned for cooperation with pin 76 when processor unit 24 is engaged with base unit 22, as illustrated in FIG. 15.

Tooth 86 preferably includes an abutment surface 90 disposed for abutment with a corresponding contact surface 92 of pawl 78 during engagement of processor unit 24 with base unit 22. Contact surface 92 is biased against abutment surface 90 by elastomeric preload member 80. The biasing force is directed against abutment surface 90, as indicated by a force arrow 94, at a position that tends to bias lever assembly 64 about pivot axis 66 towards the closed position of FIG. 1.

Furthermore, tooth 86 includes a sloped surface 96 that facilitates engagement of tooth 86 with pawl 78. Specifically, when processor unit 24 is inserted into cavity 50 of base unit 22, pawl 78 is disposed to contact sloped surface 96.

Figure 16:
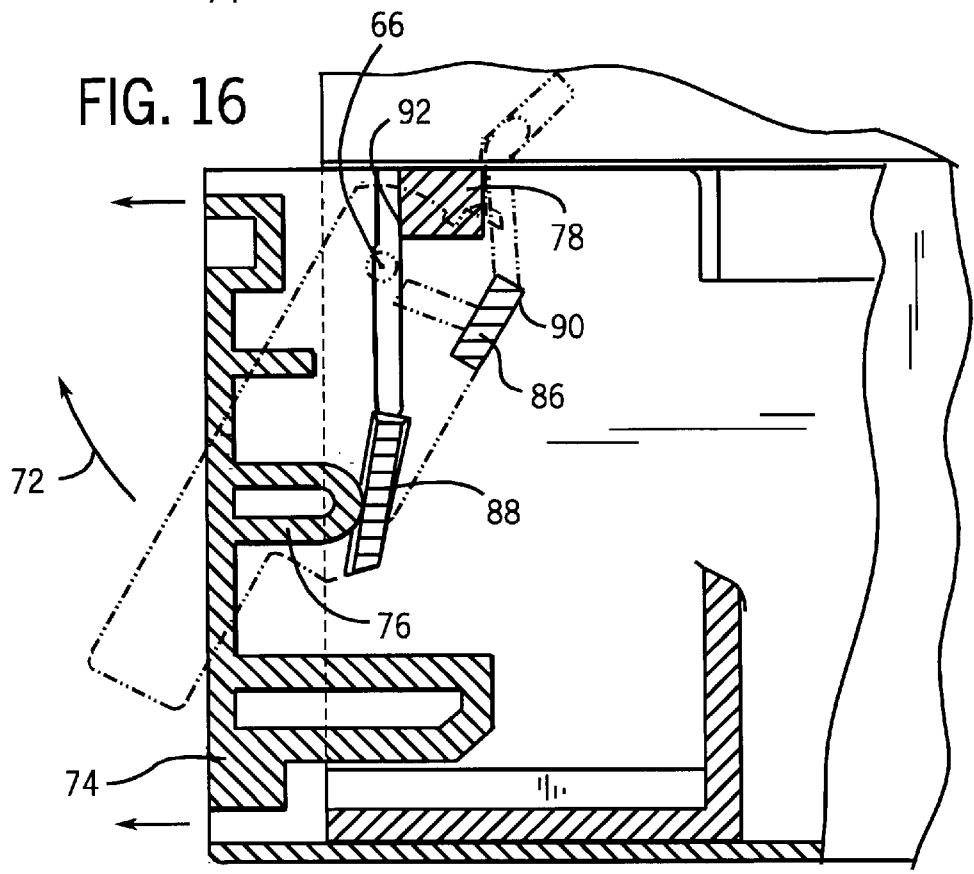
FIG. 16 is a cross-sectional view similar to that in FIG. 15 but showing the lever assembly in an actuated position.

Disengagement bar 88 generally is positioned on an opposite side of pivot axis 66 from tooth 86, and is disposed at an angle 98 (see FIG. 15) with respect to lever handle 68. The angle 98 permits disengagement bar 88 to apply a disengagement force against pin 76 in a direction that facilitates disengagement of processor unit 24 from base unit 22 along a substantial portion of the range of pivotable motion of lever assembly 64. Lever assembly 64 is illustrated in FIG. 16 at its pivoted or open position.

When processor unit 24 is engaged with base unit 22, disengagement bar 88 is disposed to rest proximate pin 76. Specifically, a small gap is disposed between bar 88 and pin 76 to permit disengagement as explained below. When lever handle 68 is pivoted from its "at rest" position in a direction indicated by arrow 72 of FIGS. 1 and 16, disengagement bar 88 pulls against pin 76 to facilitate disengagement of processor unit 24 and processor unit interface connector 58 from base unit 22 and base unit interface connector 56. Because lever handle 68 extends substantially beyond disengagement bar 88, there is substantial mechanical advantage provided to a user pivoting lever assembly 64. This mechanical advantage enhances the users ability to quickly and easily remove and interchange processor units with base units.

Other features of lever assembly 64 include a stop 100 (see FIG. 13) that prevents lever assembly 64 from pivoting beyond a desired maximum angle of rotation. Additionally, lever assembly 64 may include a return spring 102 designed to contact outer housing 46 of base unit 22 to bias lever assembly 64 towards a closed position. Thus, when lever assembly 64 is pivoted about pivot axis 66 to remove processor unit 24, return spring 102 provides slight resistance to that rotation and tends to bias lever handle 68 and lever assembly 64 towards a closed position.

To utilize controller assembly 20, a given processor unit 24 is aligned and slid into cavity 50 of base unit 22 by a user. As processor unit 24 moves into cavity 50, interlocking features 54 of processor unit 24 engage interlock slots 52 of base unit 22 to securely hold processor unit 24 in a proper orientation. Additionally, processor unit interface connector 58 engages base unit interface connector 56 such that conductive paths are created between processor unit 24 and base unit 22 via engagement of pins 60 with receptacles 62.

Furthermore, as processor unit 24 is slid toward its fully engaged position in base unit 22, pawl 78 is flexed by sloped surface 96 of tooth 86. Pawl 78 is flexed into a relief cavity 97 (best viewed in FIG. 10) until processor unit 24 becomes sufficiently inserted such that resilient pawl 78 snaps back to its original position. This leaves abutment surface 90 of tooth 86 adjacent contact surface 92 of pawl 78. This orientation of tooth 86 with respect to pawl 78 prevents the processor unit 24 from inadvertent disengagement or removal from base unit 22. Preferably, elastomeric preload member 80 of processor unit 24 engages boss 84 of base unit 22 to bias contact surface 92 against abutment surface 90 as indicated by force arrow 94. This tends to pivot lever assembly 64 about pivot axis 66 to a closed position to ensure that processor unit 24 is held securely in engagement with base unit 22.

Once processor unit 24 is fully engaged with base unit 22, pin 76 of processor unit 24 resides proximate disengagement bar 88 of lever assembly 64. When it is desirable to disengage and remove processor unit 24 from base unit 22, a user simply pulls on lever handle 68 via thumb grip area 70 to pivot lever assembly 64 about pivot axis 66 in the direction of arrow 72. Disengagement bar 88 contacts pin 76 and exerts a force against pin 76 in a direction that generally forces processor unit 24 and processor unit interface connector 58 away from base unit 22 and base unit interface connector 56. The length of lever handle 68 and the orientation of pivot axis 66 and disengagement bar 88 provide the user with mechanical advantage in forcing the disengagement of processor unit 24 via disengagement bar 88. The angle 98 assures that the disengagement force directed against pin 76 is in substantial alignment with the direction of movement of processor unit 24 during disengagement. As lever handle 68 is moved through its maximum angle of rotation, e.g., until limited by stop 100 acting against outer housing 46, disengagement bar 88 continues to act against pin 76 in disengaging process unit 24 from base unit 22.

It should be noted that during initiation of this process, tooth 86 pivots past pawl 78, permitting the user to readily pull processor unit 24 from cavity 50. To the extent tooth 86 and abutment surface 90 interfere with contact surface 92 of pawl 78, processor unit 24 can be forced slightly inward against elastomeric preload member 80 as tooth 86 slides past contact surface 92 and pawl 78. Disengagement bar 88 does not contact pin 76 until tooth 86 has cleared pawl 78.

It will be understood that the foregoing description is of a preferred exemplary embodiment of this invention, and that the invention is not limited to the specific form shown. For example, a variety of base unit housing designs and processor unit housing designs may be used; multiple types of interface connectors between the base unit and processor unit may be implemented; the circuitry and functionality of the overall controller assembly can be split in various ways between the base unit and the processor unit. The various components, such as tooth, disengagement bar, pawl and pin can be integrally formed with their corresponding lever assembly or housing or added as separate components; the lever assembly potentially can be mounted on the processor unit with the pawl and pin mounted on the base unit; and the latching mechanism can be placed at different positions with respect to the overall structure of the controller assembly. These and other modifications may be made in the design and arrangement of the elements without departing from the scope of the invention as expressed in the appended claims.

What is claimed is:

1. An automation system, comprising:
   an automation unit configured for industrial automation control, comprising:
   a processor unit configured to automatically control the operation of an industrial device;
   a mountable base unit configured to interchangeably receive the processor unit and couple the processor unit to the industrial device; and
   a latching mechanism to selectively latch the processor unit to the base unit, the latching mechanism including an integral lever disposed to facilitate separation of the processor unit from the base unit, the lever having an abutment surface that is engaged to prevent inadvertent disengagement of the processor unit from the base unit.

2. The system as recited in claim 1, wherein the integral lever is pivotably mounted to the base unit for pivotable movement about a pivot axis.

3. The system as recited in claim 2, wherein the latching mechanism comprises a tooth disposed on the lever and a pawl disposed on the processor unit, further wherein the pawl is disposed to engage the tooth when the processor unit is received by the base unit such that the processor unit is latched into the base unit.

4. The system as recited in claim 3, wherein the lever includes a handle portion disposed on an opposite side of the pivot axis from the tooth.

5. The system as recited in claim 1, wherein the latching mechanism comprises a disengagement bar disposed on the lever and a protrusion disposed on the processor unit at a location that permits the disengagement bar to contact and move the protrusion when the handle portion is lifted, wherein the movement of the protrusion disengages the processor unit from the base unit.

6. The system as recited in claim 5, further comprising a bias member disposed to bias the pawl against the tooth upon receipt of the processor unit by the base unit.

7. A programmable logic controller system, comprising:
a programmable logic controller assembly configured for industrial automation control, comprising:
a base unit having a mounting mechanism for affixing the base unit to an external structure;
a processor unit configured to engage the base unit; and
a latching mechanism that selectively fastens the processor unit with respect to the base unit, the latching mechanism including an interlocking slot and lip.

8. The system as recited in claim 7, wherein the base unit comprises a power supply, an I/O circuitry and an interface circuitry.

9. The system as recited in claim 8, wherein the processor unit comprises a CPU.

10. The system as recited in claim 9, wherein the base unit includes an interface connector for providing a conductive interface with the processor unit.

11. The system as recited in claim 7, wherein the latching mechanism includes a lever having a disengagement bar to facilitate disengagement of the processor unit from the base unit.

12. The system as recited in claim 11, wherein the latching mechanism includes a tooth and a pawl that cooperate to hold the processor unit engaged with the base unit, further wherein the tooth is disposed on the lever and the pawl is disposed on the processor unit.

13. The system as recited in claim 12, wherein the lever is pivotably mounted on the base unit for pivotable motion about a pivot axis.

14. The system as recited in claim 13, wherein the lever includes a handle portion disposed on an opposite side of the pivot axis relative to the tooth.

15. The system as recited in claim 14, wherein the lever further includes a disengagement bar positioned to disengage the processor unit from the base unit when the lever is pivoted.

16. A method for selectively latching a processor unit to a base unit of a controller system, comprising:
configuring a base unit with a receptacle for receiving a processor unit mounting the base unit for industrial automation control;
selectively engaging the processor unit with the base unit;
utilizing a latching mechanism to selectively hold the processor unit in engagement with the base unit and to selectively release the processor unit from the base unit;
incorporating a lever with the latching mechanism to provide a user with mechanical advantage in disengaging the processor unit from the base unit; and
incorporating a biasing member to bias a portion of the processor unit into engagement with a portion of the latching mechanism to prevent inadvertent movement of the lever.

17. The method as recited in claim 16, wherein the step of connecting includes pivotably mounting the lever to the base unit.

18. The method as recited in claim 17, wherein the step of selectively engaging includes utilizing an interface plug connector through which the processor unit and base unit form a conductive interface when engaged.

19. The method as recited in claim 17, further comprising connecting an integral tooth with the lever to maintain the processor unit in engagement with the base unit, and connecting an integral bar with the lever to facilitate disengagement of the processor unit upon pivoting the lever.

20. The method as recited in claim 19, further comprising biasing the processor unit against the integral tooth when the processor unit is in engagement with the base unit.

* * * * *